US009847391B1

(12) United States Patent
Zang et al.

(10) Patent No.: US 9,847,391 B1
(45) Date of Patent: Dec. 19, 2017

(54) STACKED NANOSHEET FIELD-EFFECT TRANSISTOR WITH DIODE ISOLATION

(71) Applicant: GLOBALFOUNDRIES Inc., Grand Cayman (KY)

(72) Inventors: Hui Zang, Guilderland, NY (US); Jae Gon Lee, Waterford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/479,801

(22) Filed: Apr. 5, 2017

(51) Int. Cl.
| | |
|---|---|
| *H01L 21/00* | (2006.01) |
| *H01L 29/06* | (2006.01) |
| *H01L 29/78* | (2006.01) |
| *H01L 29/165* | (2006.01) |
| *H01L 29/66* | (2006.01) |
| *H01L 27/088* | (2006.01) |
| *H01L 21/8234* | (2006.01) |

(52) U.S. Cl.
CPC .. *H01L 29/0673* (2013.01); *H01L 21/823412* (2013.01); *H01L 21/823431* (2013.01); *H01L 21/823481* (2013.01); *H01L 27/0886* (2013.01); *H01L 29/0646* (2013.01); *H01L 29/165* (2013.01); *H01L 29/66795* (2013.01); *H01L 29/785* (2013.01)

(58) Field of Classification Search
CPC . H01L 29/0673; H01L 29/785; H01L 29/165; H01L 29/66795; H01L 29/0646; H01L 27/0886; H01L 21/823431; H01L 21/823412; H01L 21/823481
See application file for complete search history.

(56) References Cited

U.S. PATENT DOCUMENTS

| | | | |
|---|---|---|---|
| 8,809,131 B2 | 8/2014 | Bangsaruntip et al. | |
| 9,461,114 B2* | 10/2016 | Obradovic | B82Y 10/00 |
| 9,698,262 B2* | 7/2017 | Pawlak | H01L 29/0607 |
| 9,711,414 B2* | 7/2017 | Hatcher | H01L 21/82380 |
| 9,748,335 B1* | 8/2017 | Bentley | H01L 29/0673 |
| 2011/0089400 A1* | 4/2011 | Ohlsson | B82Y 10/00 |
| | | | 257/13 |
| 2016/0111284 A1* | 4/2016 | Kittl | H01L 21/02532 |
| | | | 438/488 |
| 2016/0365411 A1 | 12/2016 | Yeh et al. | |
| 2017/0053982 A1 | 2/2017 | Cai et al. | |
| 2017/0179248 A1* | 6/2017 | Pawlak | H01L 29/42392 |
| 2017/0207313 A1* | 7/2017 | Song | H01L 29/42392 |

* cited by examiner

*Primary Examiner* — Nicholas Tobergte
(74) *Attorney, Agent, or Firm* — Thompson Hine LLP; Yuanmin Cai

(57) ABSTRACT

Structures involving a field-effect transistor and methods for forming a structure that involves a field-effect transistor. A substrate is provided that has a first conductivity type. A first semiconductor layer having a second conductivity type is formed on the substrate. A second semiconductor layer having the first conductivity type is formed on the first semiconductor layer. A field-effect transistor is formed that includes a fin having a plurality of nanosheet channel layers arranged in a vertical stack on the second semiconductor layer, and a gate structure wrapped about the nanosheet channel layers. The first semiconductor layer defines a first p-n junction with a portion of the substrate, and the second semiconductor layer defines a second p-n junction with the first semiconductor layer. The first p-n junction and the second p-n junction are arranged in vertical alignment with the gate structure and the nanosheet channel layers.

20 Claims, 5 Drawing Sheets

STACKED NANOSHEET FIELD-EFFECT TRANSISTOR WITH DIODE ISOLATION

BACKGROUND

The present invention relates to semiconductor device fabrication and integrated circuits and, more specifically, to structures involving a field-effect transistor and methods for forming a structure that involves a field-effect transistor.

Device structures for a field-effect transistor include a source, a drain, a channel situated between the source and drain, and a gate structure including a gate electrode and a gate dielectric separating the gate electrode from the channel. A gate voltage applied to the gate electrode is used to provide switching that selectively connects the source and drain to each other through the channel. The channel of a planar field-effect transistor is located beneath the top surface of a substrate on which the gate structure is supported.

A fin-type field-effect transistor (FinFET) is a non-planar device structure that may be more densely packed in an integrated circuit than planar field-effect transistors. A Fin-FET may include a fin consisting of a body of semiconductor material, heavily-doped source/drain regions formed in sections of the body, and a gate electrode that wraps about a channel located in the fin body between the source/drain regions. The arrangement between the gate structure and fin body improves control over the channel and reduces the leakage current when the FinFET is in its 'Off' state in comparison with planar transistors. This, in turn, enables the use of lower threshold voltages than in planar transistors, and results in improved performance and reduced power consumption.

Stacked nanowire or nanosheet field-effect transistors have been developed as a type of FinFET that may permit additional increases in packing density. A stacked nanosheet field-effect transistor may include multiple nanosheets arranged in a three-dimensional array on a substrate with a gate stack formed on the nanosheet channel regions. The gate stack may surround all sides of the channel region of each nanosheet in a gate-all-around arrangement.

SUMMARY

In embodiments of the invention, a method includes providing a substrate having a first conductivity type, forming a first semiconductor layer having a second conductivity type on the substrate, and forming a second semiconductor layer having the first conductivity type on the first semiconductor layer. The method further includes forming a fin of a field-effect transistor that includes a plurality of nanosheet channel layers arranged in a vertical stack on the second semiconductor layer, and forming a gate structure wrapped about the nanosheet channel layers. The first semiconductor layer defines a first p-n junction with a portion of the substrate, and the second semiconductor layer defines a second p-n junction with the first semiconductor layer. The first p-n junction and the second p-n junction are arranged in vertical alignment with the gate structure and the nanosheet channel layers.

In embodiments of the invention, a structure includes a substrate, a first semiconductor layer on the substrate, and a second semiconductor layer on the first semiconductor layer. The substrate and the second semiconductor layer have a first conductivity type, and the first semiconductor layer has a second conductivity type. The first semiconductor layer is arranged vertically to define a first p-n junction with a portion of the substrate, and the second semiconductor layer is arranged vertically to define a second p-n junction with the first semiconductor layer. The structure further includes a field-effect transistor on the second semiconductor layer. The field-effect transistor includes a fin with a plurality of nanosheet channel layers arranged in a vertical stack and a gate structure wrapped about the nanosheet channel layers. The first p-n junction and the second p-n junction are arranged in vertical alignment with the gate structure and the nanosheet channel layers.

In embodiments of the invention, a structure includes a substrate having a first conductivity type, a semiconductor layer having a second conductivity type, and a field-effect transistor on the semiconductor layer. The first semiconductor layer is arranged vertically to define a p-n junction with a portion of the substrate. The field-effect transistor includes a fin with a plurality of nanosheet channel layers arranged in a vertical stack and a gate structure wrapped about the nanosheet channel layers. The p-n junction is arranged in vertical alignment with the gate structure and the nanosheet channel layers.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
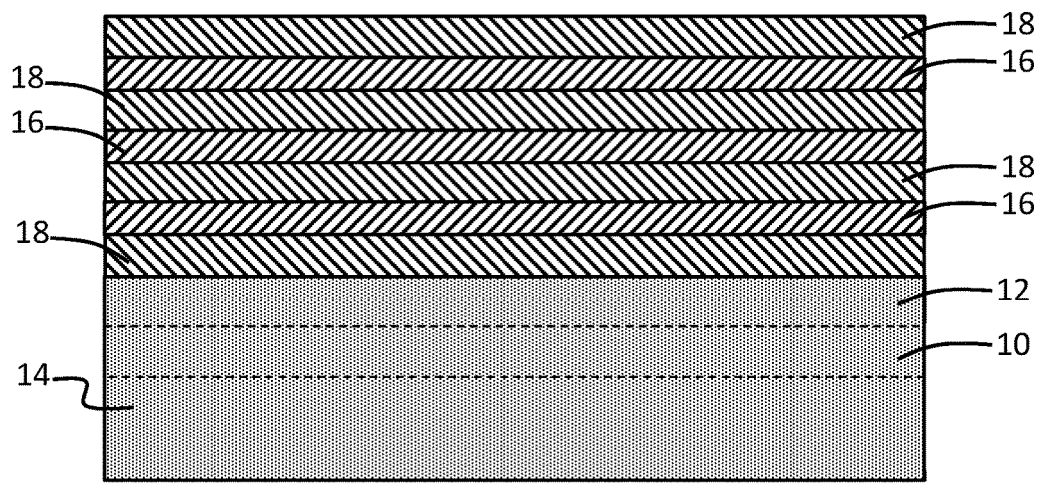
FIGS. 1-5 are cross-sectional views of a device structure at successive stages of the processing method in accordance with embodiments of the invention.

With reference to FIG. 1 and in accordance with embodiments of the invention, a doped layer 10 and a doped layer 12 are located on a substrate 14 with the doped layer 10 arranged vertically between the doped layer 12 and the substrate 14. The substrate 14 may be a bulk substrate composed of single-crystal silicon or a silicon device layer of a semiconductor-on-insulator (SOI) substrate. The doped layer 10 and doped layer 12 each have an epitaxial relationship with the substrate 14 and with each other such that the crystal structures are the same.

The semiconductor material of doped layer 12 has an opposite conductivity from the semiconductor material of doped layer 10 and, in the representative embodiment, the semiconductor material of the substrate 14 also has an opposite type from the semiconductor material of doped layer 10. In an embodiment, the semiconductor material of the doped layer 10 may be lightly doped with an electrically-active dopant, such as an n-type dopant Table (e.g., phosphorus (P), arsenic (As), or antimony (Sb)) selected from Group V of the Periodic that is effective to impart n-type conductivity, and the semiconductor materials of the doped layer 12 and the substrate 14 may be lightly doped with an electrically-active dopant selected from Group III of the Periodic Table (e.g., boron (B)) in a concentration that is effective to impart p-type conductivity. The doped layer 10 and the doped layer 12 may be formed by ion implantation of the substrate 14 or may be epitaxially grown on the substrate 14.

If the doped layers 10, 12 are formed by epitaxial growth, the crystal structure of the substrate 14 establishes a crystalline template for the growth of the crystal structure of the doped layers 10 and 12. For example, the doped layers 10 and 12 may be formed using a low temperature epitaxial (LTE) growth process, such as vapor phase epitaxy (VPE), conducted at a growth temperature ranging from 400° C. to 850° C. The semiconductor material of the doped layers 10, 12 may be in situ doped during growth to have opposite conductivity types.

If the doped layers 10, 12 are formed by ion implantation, energetic ions that confer one conductivity type are introduced through a top surface of the substrate 14 and generally stop due to energy loss over a vertical depth beneath the top surface to form the doped layer 12. Energetic ions that confer the opposite conductivity type are introduced through the top surface of the substrate 14 and generally stop due to energy loss over a vertical depth beneath the top surface to form the doped layer 10. In each instance, the ions may be generated from a suitable source gas and implanted into the substrate 14 with selected implantation conditions using an ion implantation tool. The implantation conditions (e.g., ion species, dose, kinetic energy) may be selected to determine the electrical conductivity and the depth profile (i.e., thickness) of each of the doped layers 10, 12.

Semiconductor layers 16 and sacrificial semiconductor layers 18 are formed in an alternating series as a vertical stack on the doped layer 12. The semiconductor layers 16 may be nanowires or nanosheets that are composed of a semiconductor material, such as single crystal silicon (Si). The sacrificial semiconductor layers 18 may be composed of a semiconductor material, such as silicon germanium (SiGe). The semiconductor layers 16 and 18 may be comprised of single-crystal semiconductor material formed by an epitaxial growth process, and at least the semiconductor layers 16 may be undoped. The semiconductor material of the sacrificial semiconductor layers 18 is selected to be removed selective to the semiconductor material of the semiconductor layers 16. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The number of semiconductor layers 16 and sacrificial semiconductor layers 18 may differ from the number depicted in the representative embodiment.

Figure 2:
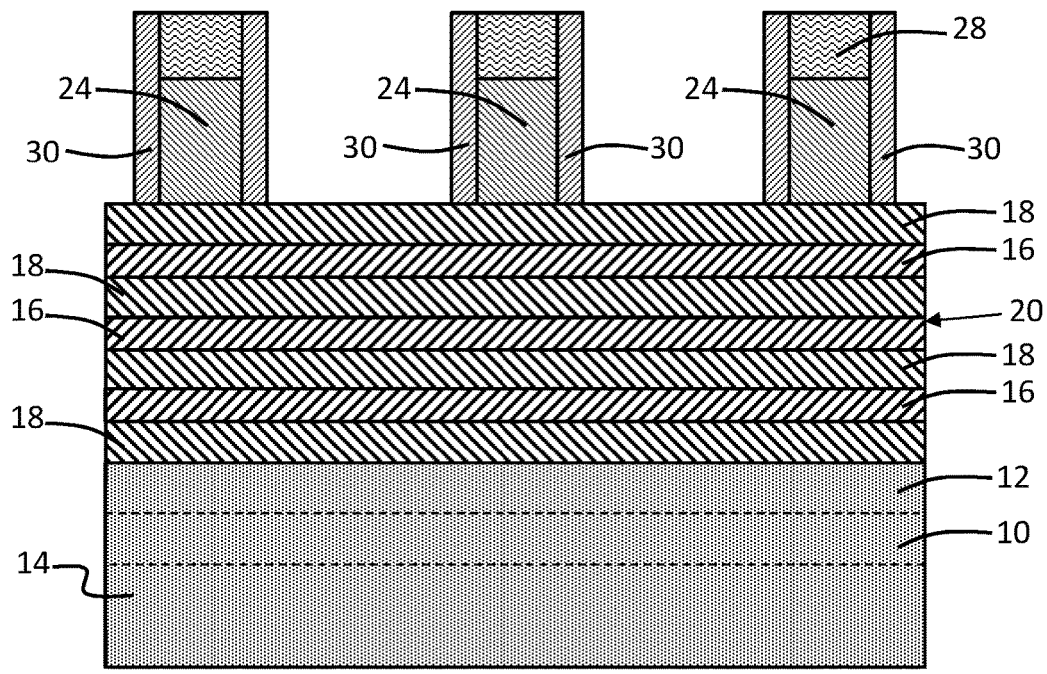
Figure 2A:
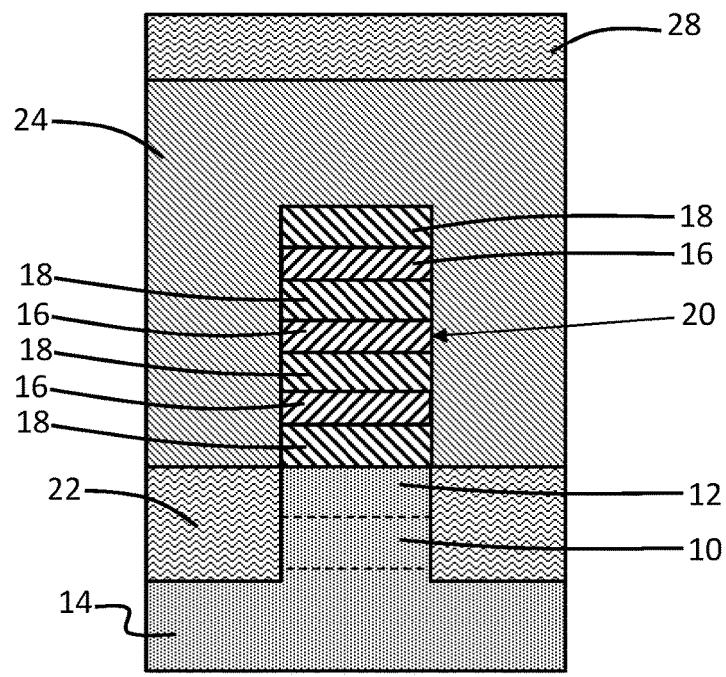
FIG. 2A is a cross-section view of the device structure taken generally in a plane extending through one of the gate structures.

With reference to FIGS. 2, 2A in which like reference numerals refer to like features in FIG. 1 and at a subsequent fabrication stage of the processing method, a fin 20 may be formed by photolithography and etching processes, such as a sidewall imaging transfer (SIT) process or self-aligned double patterning (SADP). The fin 20 is a three-dimensional body comprised of the semiconductor material of the semiconductor layers 16 and 18, and may be arranged in lengthwise parallel rows with other identical fins (not shown). The fin 20 projects in a vertical direction relative to the top surface of the doped layer 12.

Trench isolation regions 22 are formed that extend from the top surface of doped layer 12 that penetrate through the doped layer 10 and the doped layer 12, and further penetrate to a shallow depth into the substrate 14. The trench isolation regions 22 may be composed of a dielectric material, such as an oxide of silicon (e.g., silicon dioxide ($SiO_2$)), deposited by chemical vapor deposition (CVD) and etched back to the top surface of doped layer 12.

Sacrificial gate structures 24 are formed that overlap with the external surfaces of the fin 20 and the trench isolation regions 22. The sacrificial gate structures 24 may be composed of a semiconductor material such as polysilicon deposited by CVD and patterned with reactive ion etching (ME). The sacrificial gate structures 24 may be capped by respective hardmask sections 28 as a result of patterning. Spacers 30 are located adjacent to the vertical sidewalls of the sacrificial gate structures 24. The spacers 30 may be composed of a low-k dielectric material, such as silicon oxycarbide (SiOC), that is deposited and anisotropically etched.

Figure 3:
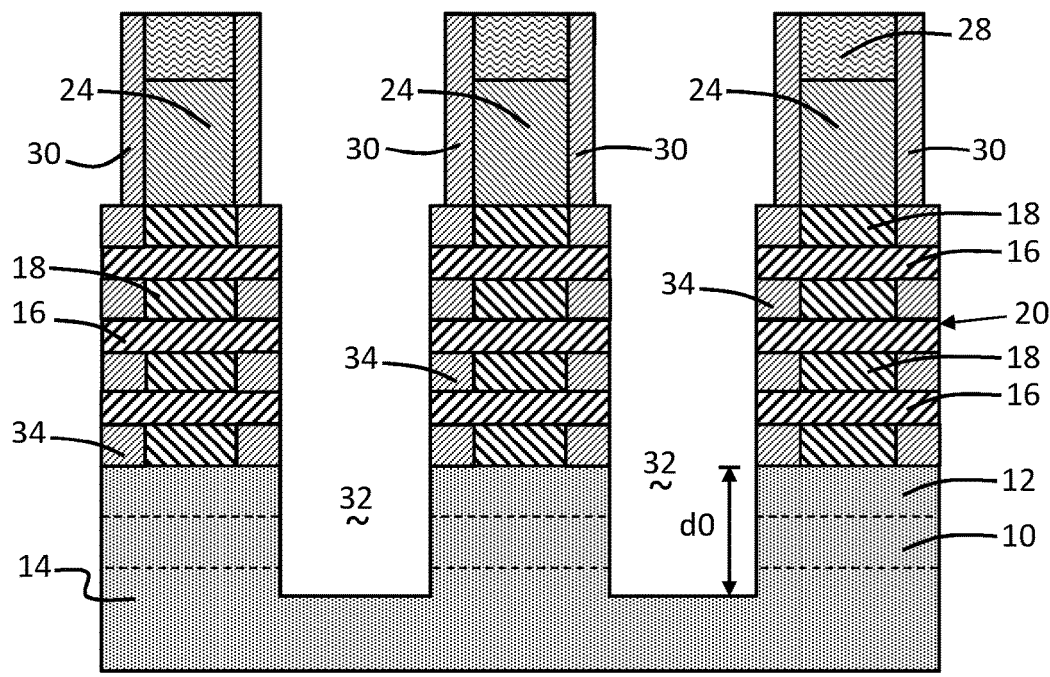

With reference to FIG. 3 in which like reference numerals refer to like features in FIG. 2 and at a subsequent fabrication stage of the processing method, trenches 32 are formed that extend from the top surface of the fin 20 through the fin 20 and both of the doped layers 10, 12 to a shallow depth into the substrate 14. The trenches 32 are located in the spacers between the sacrificial gate structures 24. Respective portions of the trenches 32 in the doped layers 10, 12 and the substrate 14 have a given depth, d0, relative to the top surface of the doped layer 12.

After the vertical sidewalls of the fin 20 are exposed by the formation of the trenches 32, the sacrificial semiconductor layers 18 are recessed with an etching process that removes the sacrificial semiconductor layers 18 selective to the semiconductor layers 16. Dielectric spacers 34 are formed in the recesses between adjacent pairs of the semiconductor layers 16. The dielectric spacers 34 may be composed of a dielectric material, such as silicon nitride ($Si_3N_4$), deposited by atomic layer deposition (ALD) in the recesses and on the vertical sidewalls and top surface of the fin 20, and etched by an isotropic etching process, such as a hot phosphoric acid etch, that removes the dielectric material that is not located inside the recesses.

Figure 4:
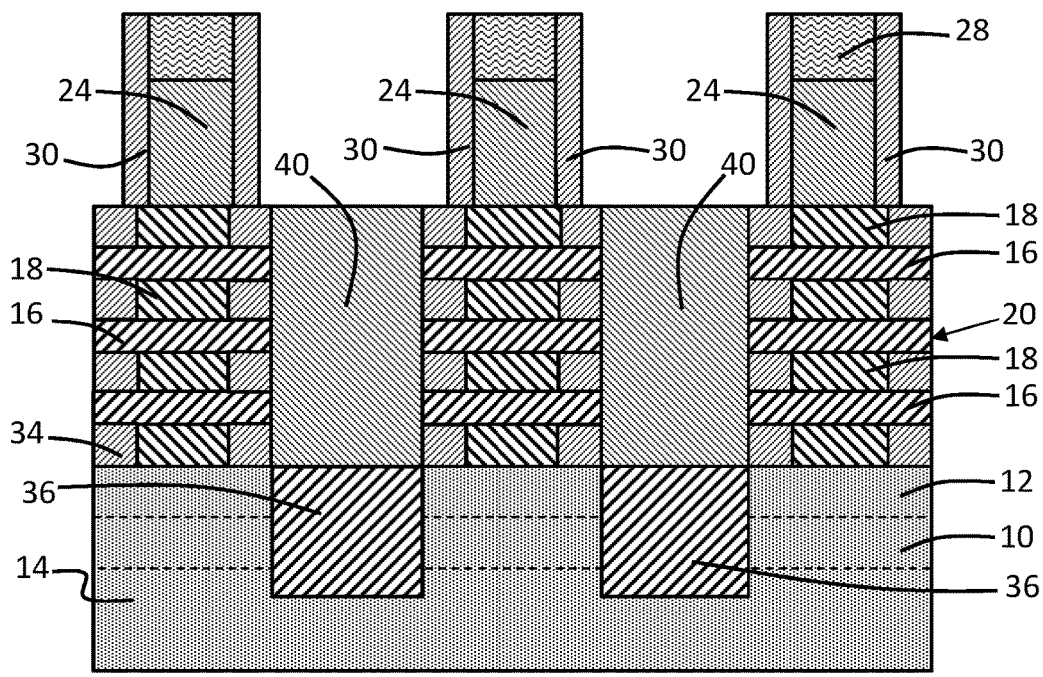

With reference to FIG. 4 in which like reference numerals refer to like features in FIG. 3 and at a subsequent fabrication stage of the processing method, the respective portions of the trenches 32 in the doped layers 10, 12 and the substrate 14 are filled with dielectric material to form trench isolation regions 36. The dielectric material constituting the trench isolation regions 36 may be an oxide of silicon (e.g., silicon dioxide ($SiO_2$)) deposited by CVD and etched back to the top surface of doped layer 12. The trench isolation regions 36 conform to the shape of the trenches 32 in the doped layers 10, 12 and the substrate 14. The trench isolation regions 36 extend vertically from the maximum depth of the trenches 32 to the top surface of the doped layer 12 and, therefore, to the bottom surface of the fin 20. As a result, the trench isolation regions 36 have a height or thickness equal to the maximum depth of the trenches 32. The trench isolation regions 36 divide each of the doped layers 10 and 12 into multiple sections.

Source/drain regions 40 of a field-effect transistor 50 are formed adjacent to the side surfaces of the fin 20 that are exposed between the sacrificial gate structures 24. The source/drain regions 40 are located on the trench isolation regions 36 and extend in a vertical direction above the trench isolation regions 36. As used herein, the term "source/drain region" means a doped region of semiconductor material that can function as either a source or a drain of a field-effect transistor. The source/drain regions 40 are connected with the semiconductor layers 16 and are physically isolated from the sacrificial semiconductor layers 18 by the dielectric spacers 34. Because at least in part due to the self-alignment afforded by the trenches 32, one of the trench isolation regions 36 is aligned with each of the source/drain regions 40.

The semiconductor material constituting the source/drain regions 40 may be heavily doped to have either p-type electrical conductivity or n-type electrical conductivity. In an embodiment, the source/drain regions 40 may be formed by a selective epitaxial growth (SEG) process in which semiconductor material nucleates for epitaxial growth on semiconductor surfaces (e.g., the semiconductor layers 16), but does not nucleate for epitaxial growth from insulator surfaces (e.g., hardmask sections 28, spacers 30, and trench isolation regions 36).

Figure 5:
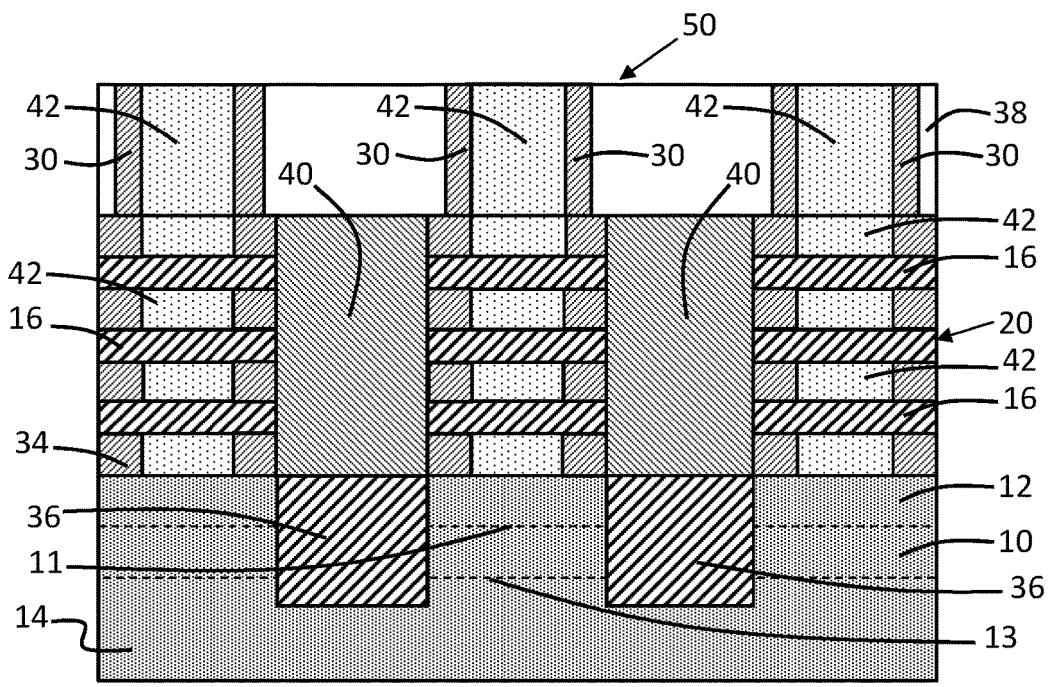

With reference to FIG. 5 in which like reference numerals refer to like features in FIG. 4 and at a subsequent fabrication stage of the processing method, a gap-fill layer 38 is deposited and planarized to be coplanar with the hardmask sections 28. The gap-fill layer 38 may be composed of a dielectric material, such as silicon dioxide ($SiO_2$), deposited by CVD. In a replacement gate process, the sacrificial gate structures 24 and sacrificial semiconductor layers 18 are removed, and replaced with functional gate structures 42 of the field-effect transistor 50. The semiconductor layers 16 define nanowire or nanosheet channel regions of the field-effect transistor 50 that are arranged in a vertical stack. Sections of the functional gate structures 42 are located in the spaces formerly occupied by the removed sacrificial semiconductor layers 18 and surround the semiconductor layers 16 in a gate-all-around arrangement in which sections of the gate structure are wrapped about the individual semiconductor layers 16.

The functional gate structures 42 may include a gate dielectric layer composed of a dielectric material, such as a high-k dielectric, and a metal gate electrode composed of one or more barrier metal layers and/or work function metal layers, such as titanium aluminum carbide (TiAlC) or titanium nitride (TiN), and a metal gate fill layer that is comprised of a conductor, such as tungsten (W). The gate dielectric layer is arranged between the gate electrode and the semiconductor layers 16. The term "sacrificial gate structure" as used herein refers to a placeholder structure for a functional gate structure to be subsequently formed. The term "functional gate structure" as used herein refers to a permanent gate structure used to control output current (i.e., flow of carriers in the channel) of a semiconducting device.

Silicidation, middle-of-line (MOL), and back-end-of-line (BEOL) processing follow, which includes formation of contacts and wiring for the local interconnect structure overlying the device structure, and formation of dielectric layers, via plugs, and wiring for an interconnect structure coupled by the interconnect wiring with the functional gate structures 42 and source/drain regions 40 of the field-effect transistor 50.

The doped layer 10 and doped layer 12, which have opposite electrical conductivity types, define a p-n junction 11 characteristic of a diode. The doped layer 10 and the substrate 14, which also have opposite electrical conductivity types, define a p-n junction 13 of a diode that is in series with the other diode. In an embodiment, the doped layer 12 and the substrate 14 may be composed of p-type semiconductor material, and the doped layer 10 may be composed of n-type semiconductor material.

These back-to-back diodes defined by the p-n junctions 11, 13 are connected in electrical series with the parasitic channel capacitance in the substrate 14 that is associated with the application of voltage to the functional gate structures 42 during switching of the field-effect transistor 50. The effective capacitance is equal to the parasitic channel capacitance in combination with the diode capacitance. Because of the introduction of the large diode capacitance, the effective capacitance is considerably less than the parasitic channel capacitance.

The doped layers 10, 12 and p-n junctions 11, 13 are arranged vertically beneath the nanosheet channel layers defined by the semiconductor layers 16 and the functional gate structures 42 of the field-effect transistor 50. The trench isolation regions 36 are only located vertically beneath the source/drain regions 40 of the field-effect transistor 50, and interrupt the continuity of the p-n junctions 11, 13 by dividing the p-n junctions 11, 13 into sections. A section of the p-n junctions 11, 13 is located in vertical alignment with each set of the functional gate structures 42 and the nanosheet channel layers defined by the semiconductor layers 16. The trench isolation regions 36 establish lateral boundaries for the side edges of the doped layers 10, 12 and termination planes for the p-n junctions 11, 13. The p-n junctions 11, 13 are located at respective depths that are shallower than the maximum depth of the trenches 32 and the trench isolation regions 36 in trenches 32.

In an embodiment, the field-effect transistor 50 may be a long-channel device in which the fin 20 has a width and a length that are long enough so that edge effects from the sides of the fin 20 can be neglected.

Figure 6:
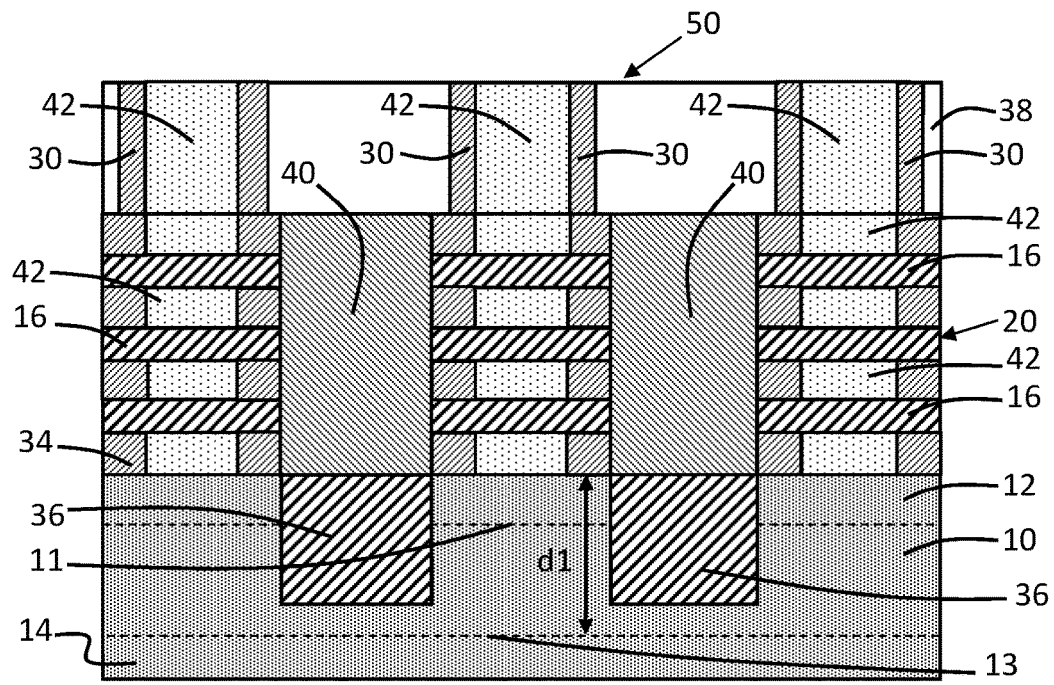
FIGS. 6-8 are cross-sectional views of device structures in accordance with alternative embodiments of the invention.

With reference to FIG. 6 in which like reference numerals refer to like features in FIG. 5 and in accordance with embodiments of the invention, the arrangement of the trench isolation regions 36 and the p-n junction 13 may be modified such that the p-n junction 13 is re-located to a depth relative to the top surface of the doped layer 12 that is beneath (i.e., deeper than) the trench isolation regions 36. Specifically, the p-n junction 13 may be located at a depth, d1, that is greater than the depth, d0 (FIG. 3). In an embodiment, the height or thickness of the doped layer 10 in the vertical direction may be increased to provide the modification. In an embodiment, the trenches 32 may be modified to only extend partially through the doped layer 10 and, therefore, to not penetrate into the substrate 14 because of the shallower depth of penetration.

Figure 7:
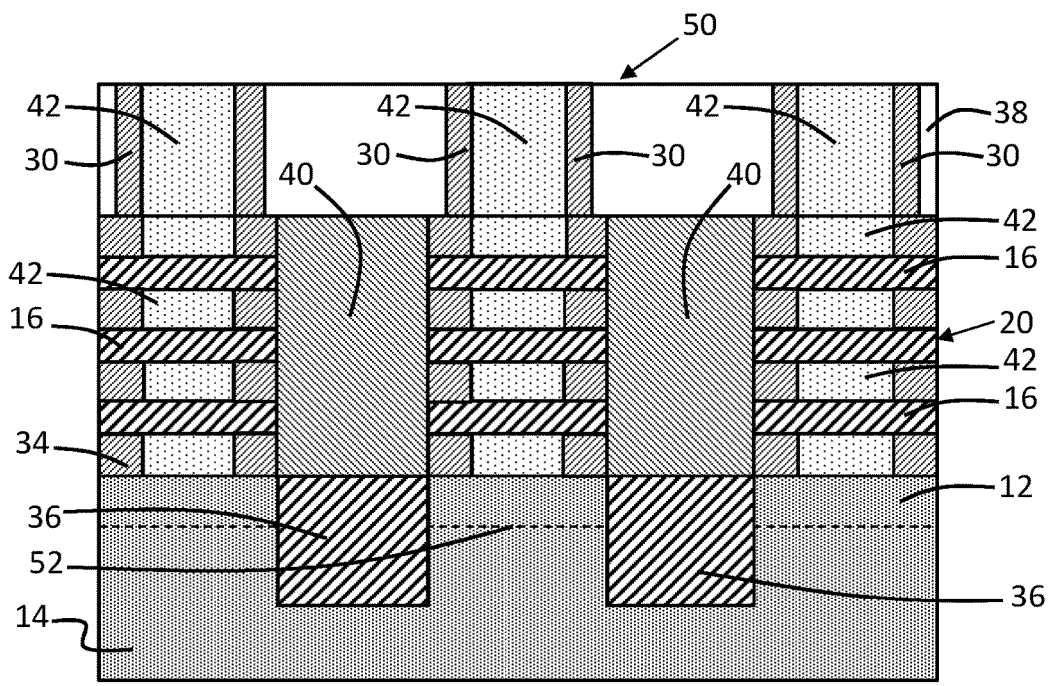

With reference to FIG. 7 in which like reference numerals refer to like features in FIG. 5 and in accordance with embodiments of the invention, the doped layer 10 may be eliminated from the structure, and the conductivity type of the semiconductor material of the substrate 14 may be selected to be opposite to the conductivity type of the semiconductor material of the doped layer 12. A finger portion of the substrate 14 extends vertically between adjacent trench isolations 36 to participate in forming a p-n junction 52 with the associated section of doped layer 12 that is located horizontally between the adjacent trench isolations 36. The presence of only a single p-n unction 52 provides a single diode that is connected in electrical series with the parasitic channel capacitance in the substrate 14 associated with the application of voltage to the functional gate structures 42 during switching of the field-effect transistor 50.

In an embodiment, the semiconductor material of the doped layer 12 may be doped to have p-type conductivity and the semiconductor material of the substrate 14 may be doped to have n-type conductivity. The doped layer 12 and the substrate 14 with such a vertical arrangement of conductivity types may be particularly suitable for a p-type field-effect transistor 50. In an embodiment, the semiconductor material of the doped layer 12 may be doped to have n-type conductivity and the semiconductor material of the substrate 14 may be doped to have p-type conductivity. The doped layer 12 and the substrate 14 with such a vertical arrangement of electrical conductivity types may be particularly suitable for an n-type field-effect transistor 50.

Figure 8:
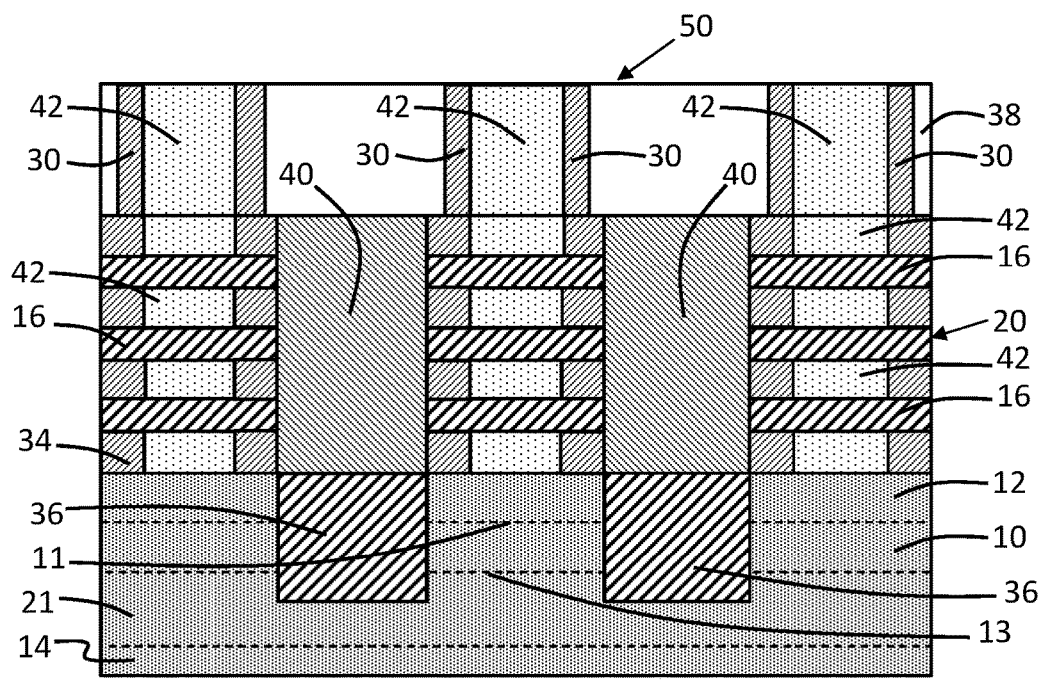

With reference to FIG. 8 in which like reference numerals refer to like features in FIG. 5 and in accordance with embodiments of the invention, the semiconductor material of doped layer 10 may be doped to have p-type conductivity, the semiconductor material of doped layer 12 may be doped to have n-type conductivity, and the doped layer 10 may be located in the semiconductor material of an n-well 21 formed, in the p-type substrate 14 by, for example, ion implantation.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a layer stack including a first semiconductor layer having a first conductivity type and a second semiconductor layer having a second conductivity type, the first semiconductor layer arranged vertically to define a first p-n junction with the second semiconductor layer; and
a field-effect transistor on the first semiconductor layer, the field-effect transistor including a fin with a plurality of nanosheet channel layers arranged in a vertical stack and a gate structure wrapped about the nanosheet channel layers,
wherein the first p-n junction is arranged in vertical alignment with the gate structure and the nanosheet channel layers.

2. The structure of claim 1 further comprising:
a first trench isolation region extending through the first semiconductor layer and the first p-n junction; and
a second trench isolation region extending through the first semiconductor layer and the first p-n junction, the second trench isolation region spaced horizontally from the first trench isolation region,
wherein the first p-n junction is arranged horizontally between the first trench isolation region and the second trench isolation region.

3. The structure of claim 2 wherein the second semiconductor layer is a semiconductor substrate.

4. The structure of claim 2 wherein the layer stack includes a third semiconductor layer having the first conductivity type, the second semiconductor layer is vertically arranged between the first semiconductor layer and the third semiconductor layer, and the third semiconductor layer defines a second p-n junction with the second semiconductor layer.

5. The structure of claim 4 wherein the first trench isolation region and the second trench isolation region each extend through the second semiconductor layer and the second p-n junction into the third semiconductor layer, and the second p-n junction is arranged horizontally between the first trench isolation region and the second trench isolation region.

6. The structure of claim 4 wherein the third semiconductor layer is a semiconductor substrate.

7. The structure of claim 4 wherein the third semiconductor layer is a well in a semiconductor substrate.

8. The structure of claim 4 wherein the first trench isolation region and the second trench isolation region extend to a first depth relative to a top surface of the first semiconductor layer, the second p-n junction is located at a second depth relative to the top surface of the first semiconductor layer, and the second depth is greater than the first depth.

9. The structure of claim 2 wherein the field-effect transistor includes a first source/drain region and a second source/drain region, the gate structure and the nanosheet channel layers are arranged horizontally between the first source/drain region and the second source/drain region, the first source/drain region is arranged in vertical alignment with the first trench isolation region, and the second source/drain region is arranged in vertical alignment with the second trench isolation region.

10. The structure of claim 1 wherein the second semiconductor layer is a semiconductor substrate.

11. The structure of claim 1 wherein the layer stack includes a third semiconductor layer having the first conductivity type, the second semiconductor layer is vertically arranged between the first semiconductor layer and the third semiconductor layer, and the third semiconductor layer defines a second p-n junction with the second semiconductor layer.

12. The structure of claim 11 wherein the third semiconductor layer is a semiconductor substrate.

13. The structure of claim 11 wherein the third semiconductor layer is a well in a semiconductor substrate.

14. A method comprising:

forming a layer stack including a first semiconductor layer having a first conductivity type and a second semiconductor layer having a second conductivity type, the first semiconductor layer arranged vertically to define a first p-n junction with the second semiconductor layer; and forming a field-effect transistor on the first semiconductor layer, the field-effect transistor including a fin with a plurality of nanosheet channel layers arranged in a vertical stack and a gate structure wrapped about the nanosheet channel layers, wherein the first p-n junction is arranged in vertical alignment with the gate structure and the nanosheet channel layers.

15. The method of claim 14 further comprising:

forming a first trench isolation region extending through the first semiconductor layer and the first p-n junction; and forming a second trench isolation region extending through the first semiconductor layer and the first p-n junction, wherein the second trench isolation region is spaced horizontally from the first trench isolation region, and the first p-n junction is arranged horizontally between the first trench isolation region and the second trench isolation region.

16. The method of claim 15 wherein the layer stack includes a third semiconductor layer having the first conductivity type, the second semiconductor layer is vertically arranged between the first semiconductor layer and the third semiconductor layer, and the third semiconductor layer defining a second p-n junction with the second semiconductor layer.

17. The method of claim 16 wherein the first trench isolation region and the second trench isolation region each extend through the second semiconductor layer and the second p-n junction into the third semiconductor layer, and the second p-n junction is arranged horizontally between the first trench isolation region and the second trench isolation region.

18. The method of claim 16 wherein the first trench isolation region and the second trench isolation region extend to a first depth relative to a top surface of the first semiconductor layer, the second p-n junction is located at a second depth relative to the top surface of the first semiconductor layer, and the second depth is greater than the first depth.

19. The method of claim 14 wherein the layer stack includes a third semiconductor layer having the first conductivity type, the second semiconductor layer is vertically arranged between the first semiconductor layer and the third semiconductor layer, and the third semiconductor layer defines a second p-n junction with the second semiconductor layer.

20. The method of claim 19 wherein the third semiconductor layer is a semiconductor substrate, or a well in the semiconductor substrate.

\* \* \* \* \*